(12) United States Patent
Yenikaya

(10) Patent No.: US 10,310,372 B1
(45) Date of Patent: Jun. 4, 2019

(54) FULL-CHIP HIERARCHICAL INVERSE LITHOGRAPHY

(71) Applicant: Cadence Design Systems, Inc., San Jose, CA (US)

(72) Inventor: Bayram Yenikaya, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 81 days.

(21) Appl. No.: 15/444,118

(22) Filed: Feb. 27, 2017

(51) Int. Cl.
*G06F 17/50* (2006.01)
*G03F 1/36* (2012.01)

(52) U.S. Cl.
CPC ............ *G03F 1/36* (2013.01); *G06F 17/5072* (2013.01)

(58) Field of Classification Search
CPC ...... G03F 7/705; G03F 7/70108; G03F 7/701; G03F 1/36; G03F 1/32; G03F 7/70125; G03F 7/70191; G03F 7/70091; G03F 7/70283; G03F 7/70433; G03F 7/70625; G03F 7/70633; G03F 7/70683
USPC ..................................................... 716/50–55
See application file for complete search history.

(56) References Cited

U.S. PATENT DOCUMENTS

| | | | |
|---|---|---|---|
| 7,398,508 B2 | 7/2008 | Shi et al. | |
| 7,793,253 B2 * | 9/2010 | Abrams | G03F 1/36 716/53 |
| 7,984,392 B2 | 7/2011 | Fu | |
| 8,122,389 B2 | 2/2012 | Sezginer et al. | |
| 8,370,773 B2 | 2/2013 | Lucas et al. | |
| 8,479,125 B2 * | 7/2013 | Pierrat | G03F 1/36 716/50 |
| 8,510,686 B2 | 8/2013 | Hendrickx et al. | |
| 8,713,488 B2 | 4/2014 | Sakajiri | |
| 8,788,982 B2 | 7/2014 | Lippincott et al. | |
| 9,953,127 B2 * | 4/2018 | Chen | G06F 17/5081 |
| 2017/0147734 A1 * | 5/2017 | Rosenbluth | G06F 17/5072 |

OTHER PUBLICATIONS

Pang et al., (Source Mask Optimization (SMO) at Full Chip Scale Using Inverse Lithography Technology (ILT) based on Level Set Method), Proc. Of SPIE, vol. 7520 (2014), 17 pages.*
Cecil et al., "Enhancing Fullchip ILT Mask Synthesis Capability for IC Manufacturability", Optical Microlithography XXIV, Proc. of SPIE vol. 7973, 79731C, 2011, 8 pages.

(Continued)

*Primary Examiner* — Nghia M Doan
(74) *Attorney, Agent, or Firm* — Foley & Lardner LLP

(57) ABSTRACT

According to certain aspects, the present embodiments relate to an inverse lithography technology (ILT) solution that provides masks with perfect symmetry and minimal complexity. A methodology according to the embodiments includes several steps and strictly maintains symmetry in each of these steps. In one step, lithographic model kernels are processed to enforce symmetry corresponding to an illumination source. In another step, an ideal grayscale mask for a target pattern is computed using the symmetrical model kernels and computation domain centered on each target polygon. In another step optimized polygons are computed using the computed grayscale mask. The final mask perfectly maintains the symmetry properties of the illumination source. An ILT solution according to the embodiments can be used on an original design hierarchy and on a full chip scale.

18 Claims, 8 Drawing Sheets

(56) References Cited

OTHER PUBLICATIONS

Kim et al., "Inverse Lithography Technology(ILT) Mask Manufacturability for Full-Chip Device", SPIE 7488, Photomask Technology 2009, Sep. 30, 2009, 8 pages.
Kim et al., "Trade-off between Inverse Lithography Mask Complexity and Lithographic Performance", Proc. SPIE vol. 7379-73791M (2009), 11 pages.
Lapedus, Mark, "What Happened to Inverse Lithography?", Oct. 20, 2016, http://semiengineering.com/what-happened-toinverse-lithography/, 10 pages.
Lv et al., "Mask-filtering-based inverse lithography", J. Micro/Nanolith, MEMS MOEMS. 12(4), Nov. 8, 2013, 17 pages.
Pang et al., "Inverse Lithography Technology (ILT) A Natural Solution for Model-based SRAF at 45nm and 32nm", Photomask and Next-Generation Lithography Mask Technology XIV, Proc. of SPIE vol. 6607, 660739, (2007), 10 pages.
Shen et al., "Level-set-based inverse lithography for photomask synthesis", Optics Express vol. 17, No. 26, Dec. 2009, 12 pages.
Xiao et al., "Affordable and Process Window Increasing Full Chip ILT Masks", Proc. SPIE 7823, Photomask Technology 2010, Sep. 29, 2010, 12 pages.
Xiong et al., "A Gradient-Based Inverse Lithography Technology for Double-Dipole Lithography", International Conference on Simulation of Semiconductor Processes and Devices, 2009, SISPAD '09, pp. 107-1010.
Yenikaya et al., "A rigorous method to determine printability of a target layout", Proc. SPIE 6521, Design for Manufacturability through Design-Process Integration, Mar. 21, 2007, 11 pages.

\* cited by examiner

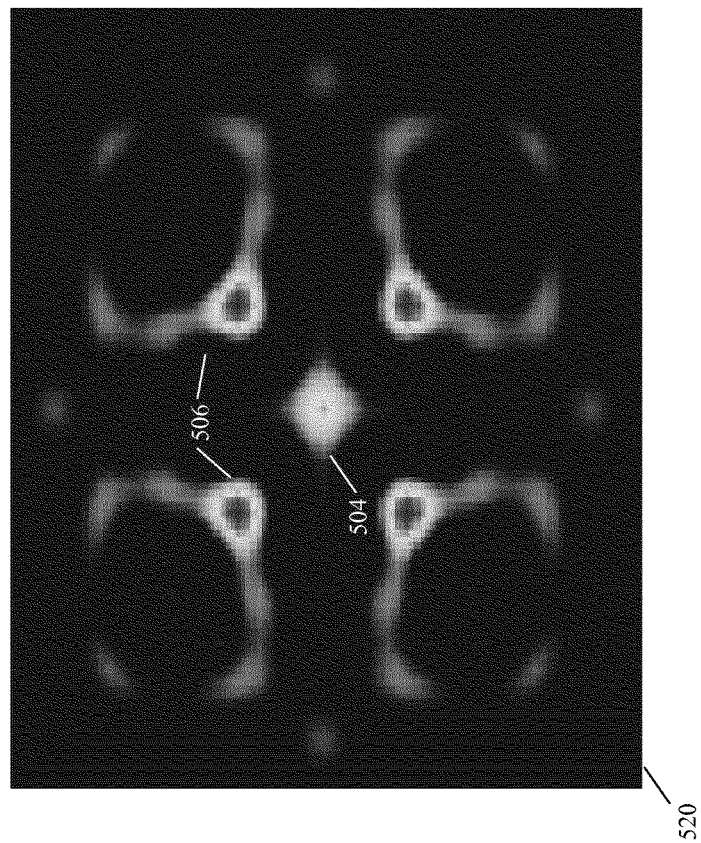
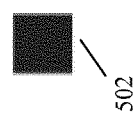
FIG. 5

FULL-CHIP HIERARCHICAL INVERSE LITHOGRAPHY

TECHNICAL FIELD

The present embodiments relate to computational lithography, and more particularly to an inverse lithography solution that can be applied to full-chip hierarchical integrated circuit designs.

BACKGROUND

Lithographic photomasks (i.e., reticles or, simply, masks) are a critical part of the integrated circuit (IC) supply chain. A chipmaker designs an IC, which is then translated into a file format. Then, a photomask is developed based on that file format. Basically, the mask is a master template for a given IC design. After a mask is developed, it is shipped to the fab. The mask is placed in a lithography scanner. The scanner projects light through the mask, which patterns the images on a wafer. Diffraction occurs when a beam of light passes through the scanner to the mask. The light waves spread out, and sometimes are accompanied by interference. Therefore, a pattern as it was designed to be printed on the wafer could become blurred or lost.

To deal with the diffraction and other issues causing the pattern printed on the wafer to become distorted, chip designers and mask makers use various resolution enhancement techniques (RETs) on the mask pattern. One RET, called optical proximity correction (OPC), is used to modify the mask patterns to improve the printability on the wafer. Among other things, OPC makes use of tiny sub-resolution assist features (SRAFs), or decoration-like shapes, on the mask. The SRAFs themselves do not print on the wafer, but instead cause the printed pattern to better match the intended pattern or target pattern. Inverse lithography technology (ILT) is a next-generation RET that enables generating an optimal mask pattern having SRAFs. Using complex mathematics, ILT improves the latitude of a process and the depth of focus for a lithography tool. In general, ILT involves receiving as an input the target patterns of an IC that are desired to be printed on the wafer. Then, models of the scanner optics and resists are formulated. Using the target patterns and the models, the optimal mask pattern, including SRAFs, is inversely calculated.

The idea of ILT was first introduced more than thirty years ago. Since then ILT has become a major area of research in the field of computational lithography. Today, ILT is mostly used in only niche applications, mainly for hot spot repair on the mask. Ultimately, however, the industry hopes to devise "full-chip ILT masks," which involves the integration of the technology for all layers, not just for some isolated features on a particular reticle. Full-chip ILT may help ease the constraints in advanced patterning, as the technology could enable the most difficult features, such as tiny contacts, cuts and vias, in IC designs.

Unfortunately, conventional full-chip ILT is too impractical and is therefore mostly avoided. For example, generating a mask pattern for a target pattern using conventional ILT techniques can take up to ten times as long as generating a mask pattern using OPC techniques. Likewise, write times for a typical mask can be 8, 12 or 24 hours. With mask patterns generated using conventional ILT, write times are significantly longer, such as up to five days. Various methods and algorithms have been developed to attempt to address these and other problems afflicting ILT (see, e.g., B-G. Kim et. al. "Trade-off between Inverse Lithography Mask Complexity and Lithographic Performance." Proc. SPIE vol 7379-73791M (2009); T. Cecil et. al. "Enhancing Fullchip ILT Mask Synthesis Capability for IC Manufacturability." Proc. SPIE 7973, Optical Microlithography XXIV, 79731C (2011); Yijiang Shen, Ngai Wong, and Edmund Y. Lam, "Level-set-based inverse lithography for photomask synthesis," Opt. Express 17, 23690-23701 (2009); and Linyong Pang, Yong Liu and Dan Abrams, "Inverse lithography technology (ILT): a natural solution for model-based SRAF at 45 nm and 32 nm," Proc. SPIE 6607, Photomask and Next-Generation Lithography Mask Technology XIV, 660739 (May 15, 2007)), however none have been satisfactory.

SUMMARY

According to certain aspects, the present embodiments relate to an inverse lithography technology (ILT) solution that provides masks with perfect symmetry and minimal complexity. A methodology according to the embodiments includes several steps and strictly maintains symmetry in each of these steps. In one step, lithographic model kernels are processed to enforce symmetry corresponding to an illumination source. In another step, an ideal grayscale mask for a target pattern is computed using the symmetrical model kernels and computation domain centered on each target polygon. In another step optimized polygons are computed using the computed grayscale mask. The final mask perfectly maintains the symmetry properties of the illumination source. An ILT solution according to the embodiments can be used on an original design hierarchy and on a full chip scale.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 5 is a diagram illustrating an example grayscale map computed for an isolated contact hole target pattern using the methodology of the present embodiments;

DETAILED DESCRIPTION

Figure 1:
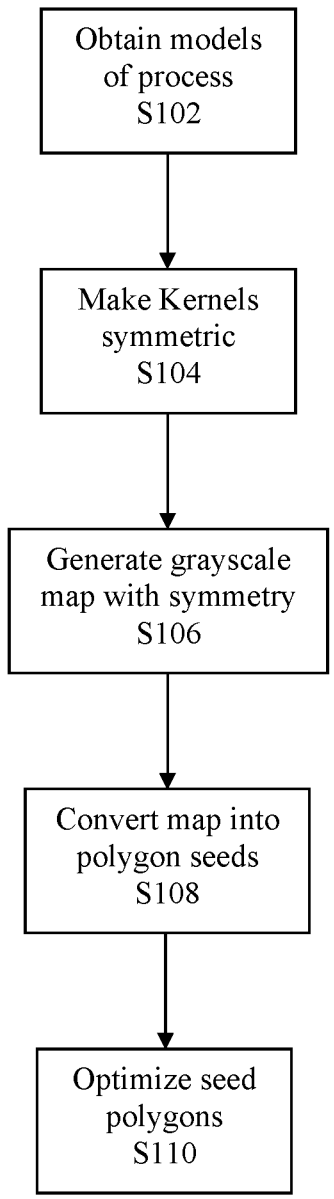
FIG. 1 is a flowchart illustrating an example methodology according to the embodiments.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

As set forth above, ILT is among the most studied areas in computational lithography. Several methods like level sets, total variation, and pixelated masks have been proven to produce effective results. However, the present applicant has recognized that these methods have not gained traction in manufacturing flows due to two major problems. First, the complexity of the masks generated using conventional ILT methods creates challenges in manufacturing and inspection. Second, the lack of symmetry in the solution breaks the hierarchy of the designs and forces users to flatten their designs. Flattening the designs increases computation time which makes it impossible to run already slow ILT solutions on a full chip scale. In any event, even with partially flattened designs the areas near the boundary of two neighboring regions often get mismatching solutions introduced by numerous noise factors such as pixel placement, non-uniqueness of solutions, and interactions which are larger than the halo size. These mismatching areas need to be detected and fixed in a post processing flow. The mask complexity problem can be addressed by introducing mask constraints into the solutions, however these constraints create a tradeoff between mask complexity and lithographic performance. The benefits of ILT are lost when masks are regularized to be manufacturing friendly. Moreover, the lack of symmetry issue has not been addressed in any of the solutions presently available.

According to certain aspects, the present embodiments relate to an ILT solution that addresses these and other problems. In embodiments, the symmetry problem is addressed by enforcing strict error controls throughout the optimization. The masks generated by the present embodiments are symmetric, such that the same target pattern always provides the same mask pattern. This feature enables the solution to be applied hierarchically. According to certain additional aspects, the generated mask according to the embodiments is manufacturing friendly and the loss of lithographic performance due to using simpler masks is mostly recovered by co-optimization of all mask components (main features and assist features).

A flowchart illustrating an example methodology according to the present embodiments is shown in FIG. 1.

As shown, in step S102, a model of the patterning process, including the optical system used in the patterning process, is obtained. In embodiments, the computational model (i.e. optical model) includes a physical-optics calculation of image formation within the optical system and a model of the blur caused by molecular diffusion in the photoresist.

In step S104, eigenvectors (i.e., kernels) corresponding to the model of the optical system obtained in step S102 are generated. Hopkins' formulation of matrix form of the optical model is used and eigenvectors (i.e. kernels) are generated using singular value decomposition (SVD) or arnoldi algorithms. In conventional computational lithography, the values of generated kernels are typically only symmetric up to a precision of typically $1e^{-12}$. According to the present embodiments, the generated kernels are further processed in step S104 so as to have the same symmetry as the source by fixing all numerical errors.

In step S106, a grayscale map is generated for the target pattern that is symmetric regardless of the position and orientation of the target. As described in more detail below, example embodiments achieve this as follows. In a first aspect, one computation per target polygon is performed by moving the polygon center to the origin of the computation domain. That way, the polygon's position with the underlying grid is fixed. According to another aspect, computations for all the target polygons are combined into one map by picking the largest value from each map and when values are close to each other make a symmetric choice.

As used herein, the term target pattern refers to the pattern that a designer of an IC desires to be printed on a wafer. The target pattern comprises a set of polygons or target polygons, and these target polygons remain invariant throughout the process of obtaining an optimal mask pattern according to the present embodiments.

In step S108, the map is used to create polygon seeds for the mask pattern, including seed polygons corresponding to SRAFs. This is done while satisfying mask manufacturability rule checks (i.e. MRCs) for the polygons and suppressing side-lobes. This placement is a very good initial guess for an optimization algorithm that can enhance them.

More particularly, in step S110 the seed polygons are optimized, thereby obtaining the final mask pattern. Edges of the main polygons and SRAFs are optimized together. Embodiments apply a fully constrained optimization method that seeks the following goals: (1) The output mask polygons should satisfy all the user defined MRCS; (2) There should be no side-lobes printing within a user defined dose and focus range; (3) The pattern should print on target under best focus and dose conditions; (4) The process window should be maximized.

Example ways of performing the process illustrated in FIG. 1 according to the present embodiments are explained in more detail below.

Figure 2:
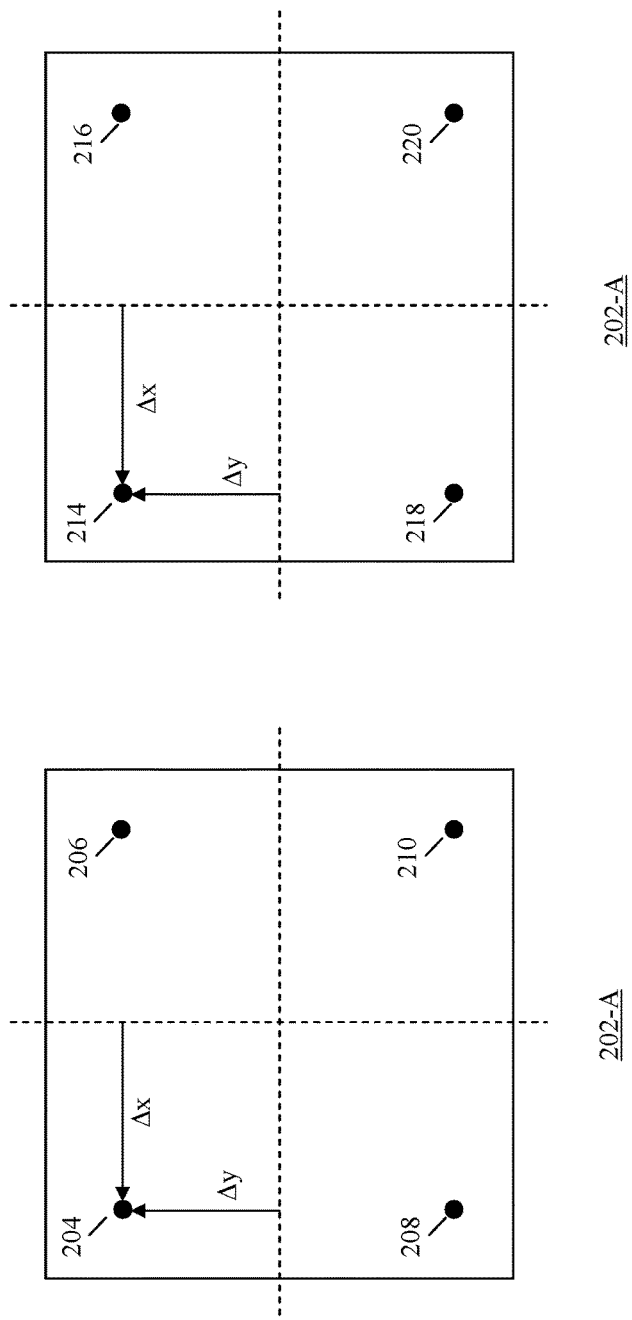
FIG. 2 is a diagram illustrating aspects of enforcing symmetry in lithographic models according to the embodiments.

As set forth above, according to the present embodiments, the model kernels are processed so as to have the same symmetry as the source by fixing all numerical errors. Typically, the kernels are in the form $V_1^*, V_2^*, \ldots, V_N^*$, which are N complex conjugate pairs of eigenfunctions of a Hermitian, positive-semidefinite operator. For example, as shown in FIG. 2, one of the N complex conjugate eigenvector pairs $V_n^*$ includes eigenvectors 202-A and 202-B. Each eigenvector in the pair comprises complex number values for a grid of points (i.e. pixels) having a domain radius of, for example, 700 nm. The density of this grid (i.e. the distance between points or pixels in the grid) exceeds the Nyquist sampling rate for intensity.

Enforcing symmetry within each eigenvector of the pair is performed as follows. As shown in FIG. 2, a particular point 204 in the grid of points comprising eigenvector 202-A is located distance delta x, delta y from center. Points 206, 208 and 210 are similarly located distance delta x, delta y from center. According to certain aspects, enforcing symmetry is achieved by forcing the values of 202-A at points 204, 206, 208 and 210 to all be the same, which corresponds to the symmetry of the illumination source in this example (e.g. a quadrupole source). This is done by, for example, determining the average of the values at points 204, 206, 208 and 210 and then replacing the original values at all of points 204, 206, 208 and 210 with the determined average. This process is performed for all grid points in all eigenvector pairs.

Sometimes a pair of eigenvectors 202-A and 202-B have the same eigenvalue at a certain point, for example designated as V1 and V2. V1 and V2 do not have to be symmetric individually, only the sum of their squares need to be symmetric. Embodiments, therefore, modify V1 and V2 in a way that the sum of their squares have perfect symmetry with full precision. This is done by using the fact that V1 and V2 are basis vectors of a space and a different basis can be found that spans the same space whose sum of squares is perfectly symmetric. The new basis vectors are V1'=aV1+bV2, and V2'=cV1+dV2. In these and other embodiments, values of a, b, c, and d complex valued numbers are found so as to makes the sum of squares of V1' and V2' perfectly symmetric. In one example, to achieve this, first find a and b values that make V1 perfectly symmetric up to the sign, meaning the magnitude of the values is symmetric but the sign can be different. Similarly find c and d for V2'. Once this is achieved the sum of squares cancels the negative signs and becomes perfectly symmetric.

In addition to enforcing the model kernels to be symmetric as described above, embodiments cause all the values that go into the ILT matrix to be symmetric regardless of the position and orientation of the lithography target. Examples of how this is done are described in more detail below.

First, as set forth above in step S106, one grayscale mask computation per target polygon is performed by centering the polygon at the origin of the computation domain. That way the target polygon's position with underlying grid is fixed. For example, a target pattern such as that shown in FIG. 3 includes polygons 302, 304, 306, 308, 310 and 312. These polygons are shown as having the same shapes and dimensions for ease of illustration; however, the embodiments are not limited to this simple example.

The computation domain 320 (i.e. a domain corresponding to the grid of eigenvector points as described above in connection with FIG. 2) for generating a grayscale map for each polygon is centered on the polygon. As shown, in this example domain 320 is centered on polygon 302. A grayscale map is computed for this polygon 302 as described in more detail below with the domain 320 thus centered.

More particularly, as in conventional ILT, a grayscale map for each target polygon in a target pattern is computed using the model kernels as processed to be symmetrical as described above. Using the models, an estimate of the latent image formed in the wafer (represented by the function U in the descriptions below) can be predicted for a given mask pattern, and thus used to inversely compute a mask pattern that will faithfully reproduce the target pattern. In embodiments, a grayscale map for a mask pattern is obtained by minimizing a cost function that incorporates the predictions of the latent image using the optical system model kernels. The cost function for this step can be, for example, a cost function as described in B. Yenikaya and A. Sezginer, "Model-Based Assist Feature Generation," Proc. SPIE Vol. 6521, manuscript 22 (2007), the contents of which are incorporated by reference herein in their entirety.

Figure 4A:
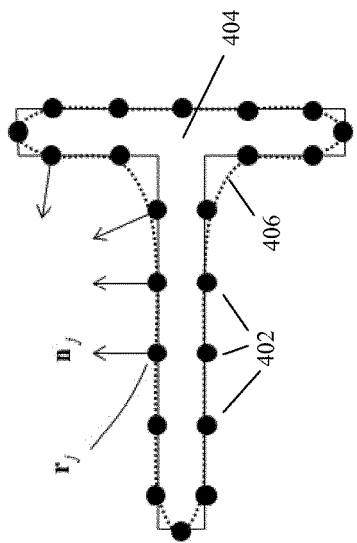
FIGS. 4A and 4B are diagrams illustrating further aspects of computing symmetrical grayscale maps according to the embodiments.

For each target polygon for which the grayscale map is being computed, target points 402 are placed on the edges of the polygon 404 as illustrated in FIG. 4A. The linear density of the target points is close to the Nyquist sampling rate for the band-limited intensity function. Target points 402 are not placed at the vertices of polygons since resist edges cannot have sharp corners. The corners are smoothed until the curvature of the target resist curve 406 is at or below a curvature that is realizable by lithography and the edges are placed on the rounded corners. In this way, the information contained in the target layout is reduced to a set of edge target-points. Conceptually, the target points are joined by a target resist curve 406.

As further shown in FIG. 4A, curve 406 has a well-defined normal vector $n_j$ at the jth target point $r_j$ where j=1, 2, . . . J and J is the total number of edge target points 402 in the computation domain. The unit normal $n_j$ points in the direction of increasing image intensity. If the features (polygons) represent the dark regions in a bright background field, then $n_j$ is the outward normal of the target curve 406. On the other hand if the features (polygons) represent the bright regions in a dark background field, then $n_j$ is the inward normal of the target curve 406. The resist edges are required to pass within a certain tolerance of the target points. The resist edge may deviate from the edge by at most $\varepsilon_{0j}$ and $\varepsilon_{1j}$ in the directions into and away from the target polygon 404, respectively, for any dose and defocus combination in the desired process-window. The edge placement tolerances $\varepsilon_{0j}$ and $\varepsilon_{1j}$ may be the same or different and their values may change in different parts of the layout. This lets us to assign tighter tolerances to more critical parts of the layout.

Figure 4B:
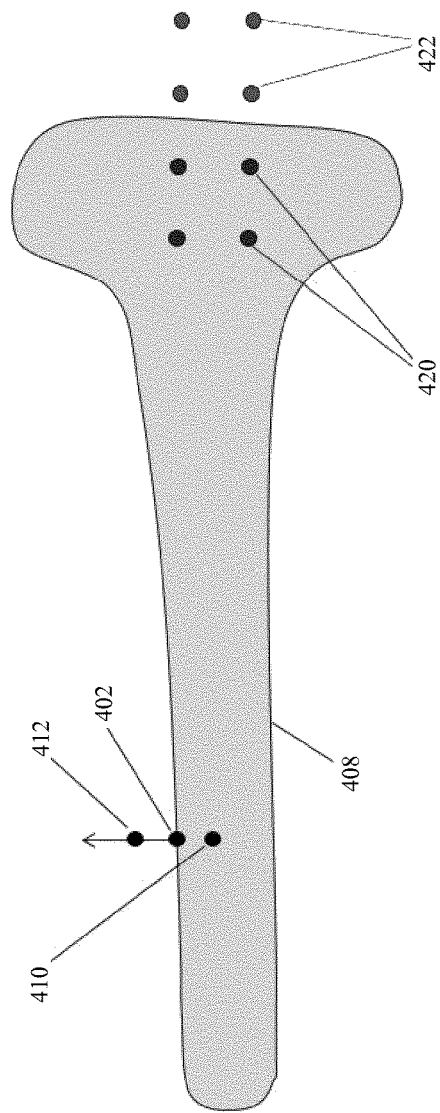

Referring to FIG. 4B, the resist edge 408 is required to pass between the tolerance points 410 and 412 offset from target point 402 by $-n_j\varepsilon_{0j}$ and $n_j\varepsilon_{1j}$, respectively. This is equivalent to requiring these inequalities of the latent image intensity U:

$$\left. \begin{array}{l} U(r_j - n_j\varepsilon_{0j}, z_l) \le \tau_{L,l} \\ U(r_j + n_j\varepsilon_{1j}, z_l) \ge \tau_{U,l} \end{array} \right\} l = 1, 2, \ldots, L \quad (1)$$

$$\tau_{L,l} = \frac{\text{dose-to-clear}}{\text{dose}_{max,l}}$$

$$T_{U,l} = \frac{\text{dose-to-clear}}{\text{dose}_{min,l}}$$

Here, $U(r, z_l)$ represents the normalized latent image intensity at the two dimensional image point r=(x, y) in the photoresist; and $z_l$ is the defocus value. Note that $z_l$ and (x, y) are different type of variables: $z_l$ indicates the axial position of the wafer stack as opposed to relative coordinates (x, y) of a point inside the photoresist with respect to the wafer. The intensity $U(r, z_l)$ can be computed at one plane in the photoresist, or it could be the integral of the image intensity across the thickness of the photoresist. The index e labels discrete defocus values. The exposure latitude for defocus $z_l$ is required to be in between [$\text{dose}_{min}$, $\text{dose}_{max}$]. This is the most general process-window definition. For simplicity, one can require a rectangular window in the dose-defocus plane. In that case, there is only one dose interval [$dose_{min}$, $dose_{max}$] which does not depend on defocus, hence the index l. In embodiments, the latent image intensity $U(r, z_l)$ can be obtained by applying a model of the resist blur to the optical image intensity in the photoresist. The intensity is normalized so that the image of a clear mask has unity intensity. Dose-to-clear is the dose beyond which a positive photo-resist dissolves upon development. The dissolution reaction rate versus exposure dose can be approximated with a step function. $\tau_{L,l}$ and $\tau_{U,l}$ in (1) represent the intensity threshold for this step function for the minimum and maximum dose.

In addition to the edge constraints (1), the image intensity must satisfy:

$$U(r_{GRID}, z_l) \leq (\text{dose-to-clear})/(D_{max}) \equiv t_L \text{ if } r_{GRID} \text{ is in a dark feature in the target layout} \quad (2a)$$

$$U(r_{GRID}, z_l) \geq (\text{dose-to-clear})/(D_{min}) \equiv t_U \text{ if } r_{GRID} \text{ is in a bright feature in the target layout} \quad (2b)$$

Constraints (2a) and (2b) ensure that the printed pattern and the target pattern will have the same topology when the exposure dose is between $D_{min}$ and $D_{max}$; side-lobes and assist features will not print; and features will not bridge or pinch out in the specified dose interval. The dose interval in (2), [$D_{min}, D_{max}$], is selected to be larger than the dose interval required in the edge-placement specification in (1) because bridging and pinching are fatal defects. They require a safety margin to account for random nature of resist dissolution and scumming. Constraints (2a) and (2b) are enforced on a regular 2-dimensional grid. The density of this grid exceeds the Nyquist sampling rate for intensity.

A vector cost function can be set up using the constraints (1) and (2) and minimize its Euclidian-length during the optimization. This vector cost function, f, is given as:

$$f = \begin{bmatrix} \max\{0, U(r_j - \hat{n}_j \varepsilon_{0j}, z_l) - \tau_{L,l}\}; j=1,2,\ldots J; l=1,2,\ldots,L \\ \max\{0, \tau_{U,l} - U(r_j + \hat{n}_j \varepsilon_{1j}, z_l)\}; j=1,2,\ldots J; l=1,2,\ldots,L \\ \max\{0, U(r_{GRID,DARK}, z_l) - t_L\}; l=1,2,\ldots,L \\ \max\{0, t_U - U(r_{GRID,DARK}, z_l) - t_L\}; l=1,2,\ldots,L \\ \max\{0, m(r_{GRID}) - m_{MAX}\} \\ \max\{0, m_{MIN} - m(r_{GRID})\} \end{bmatrix} \quad (3)$$

The first line on the right hand side of (3) represents the first J×L entries in the cost function which correspond to the design requirement that the resist edge 408 may not deviate into the target feature 404 (in the inward direction) by more than $\varepsilon_{0j}$ in the required process-window. The second line on the right hand side of (3) represents the next J×L entries which correspond to the requirement that the resist edge 408 cannot deviate away (in the outward direction) from the target features 404 by more than $\varepsilon_{1j}$ in the required process-window. The third and fourth lines on the right hand side of (3) represent the constraints on the image intensity sampled on the grid points 420, 422 which is described above in (2). The constraints on the intensity at the grid points that are close to the edges are redundant because the edge constraints already satisfy them; therefore, they are dropped from (3). Note that when a constraint is not active (not violated) its contribution to the cost function is zero. The cost function is continuous and continuously differentiable everywhere except at the point where it crosses zero. At this point the constraint becomes inactive and that component is dropped from the cost function.

The optimization (minimization of the cost function) acts on the mask pattern. The Fourier series expansion of the mask transmission function m(x,y) is used and the sum of squares (3) with respect to this vector of Fourier coefficients is minimized. The cost function f and its Jacobian matrix are readily computed using the sum of coherent systems SOCS formulation. The mask function m(x,y) can be chosen to be real or complex valued in the optimization. In the examples of the present embodiments, m(x,y) is assumed to be real but possibly negative valued. The following constraints to the mask function are applied:

$$m_{MIN} \leq m(x, y) \leq m_{MAX};$$

$$\{m_{MIN}, m_{MAX}\} = \begin{cases} \{0, 1\} & \text{for binary masks} \\ \{-\sqrt{attn}, 1\} & \text{for attenuated-}PSM\text{ masks} \\ \{-1, 1\} & \text{for }AA\text{-}PSM\text{ and }CPL\text{ masks} \end{cases}$$

These constraints are enforced on the a uniform 2-dimensional grid and they are represented by the last two lines on the right hand side of (3). When the cost function is minimized, the cost function is not necessarily zero, which means not all design requirements are met. Since each entry of f corresponds to a particular target or grid point, the part of the layout where design requirements are not met becomes evident. If the design requirements are unattainable, f=0 will not be satisfied for any mask. An example algorithm that can be used for checking the feasibility of the design requirements is described in B. Yenikaya and A. Sezginer, "A rigorous method to determine printability of a target layout," Proc. SPIE Vol. 6521, manuscript 38 (2007).

The inverse lithography mask solution 520 for a target polygon comprised of an isolated contact hole 502, optimized with the cost function (3) of the present embodiments is shown in FIG. 5. In this example, a C-quad illumination source with sigma from 0.7 to 0.9 is used on an immersion scanner with NA=1.35. As shown, the grayscale map 520 includes a bright area 504 (brightness in this example representing the positive contribution that an element at that location in a mask pattern will make toward reproducing the target polygon) corresponding to the target polygon 502 and additional bright areas 506, which can be used to create assist features, as described in more detail below.

Figure 3:
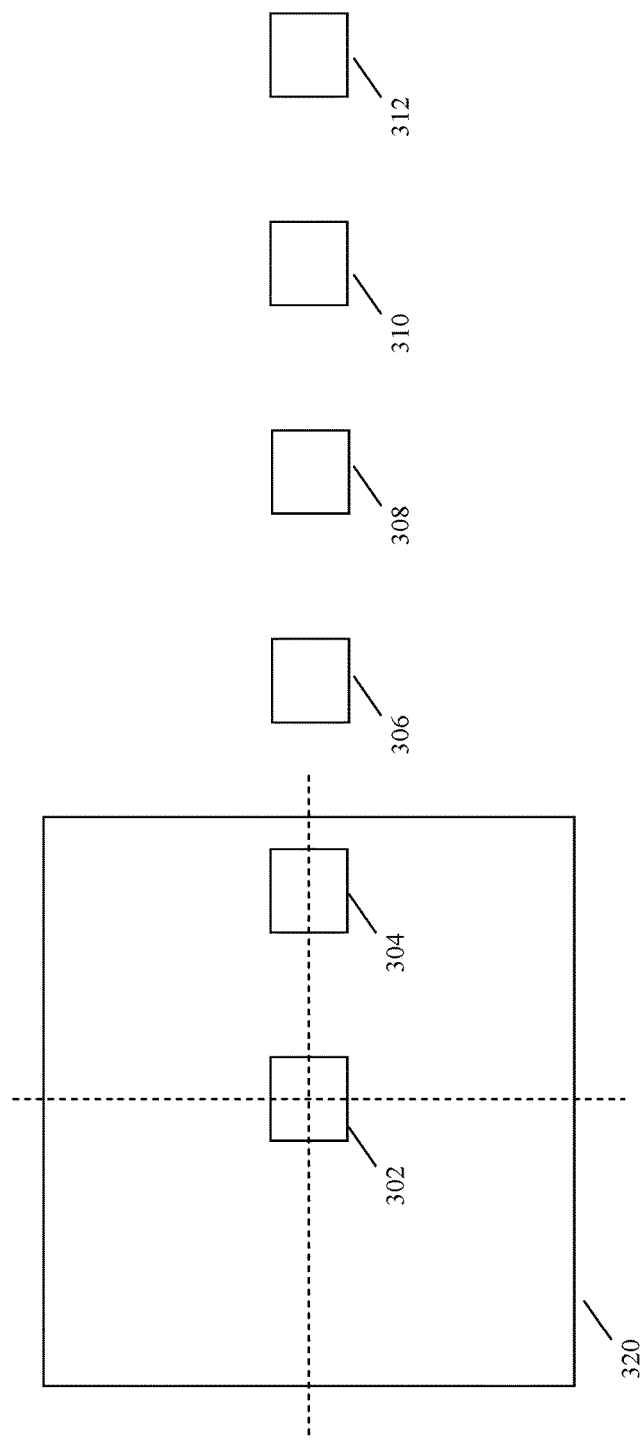
FIG. 3 is a diagram illustrating aspects of computing symmetrical grayscale maps according to the embodiments.

As set forth above, a grayscale map such as 520 shown in FIG. 5 is generated for each target polygon, with the computation domain centered on the polygon. For a target pattern comprising many polygons, the generated maps for each polygon are combined to form a combined map for the pattern. It should be noted that, as shown in FIG. 3, the generated map for each target polygon (e.g. polygon 302) may include contributions from other target polygons (e.g. polygon 304). In example embodiments, the computations for all polygons in a target pattern are combined into one map by picking the largest values from each map, and when values are close to each other, making a symmetric choice.

Figure 6:
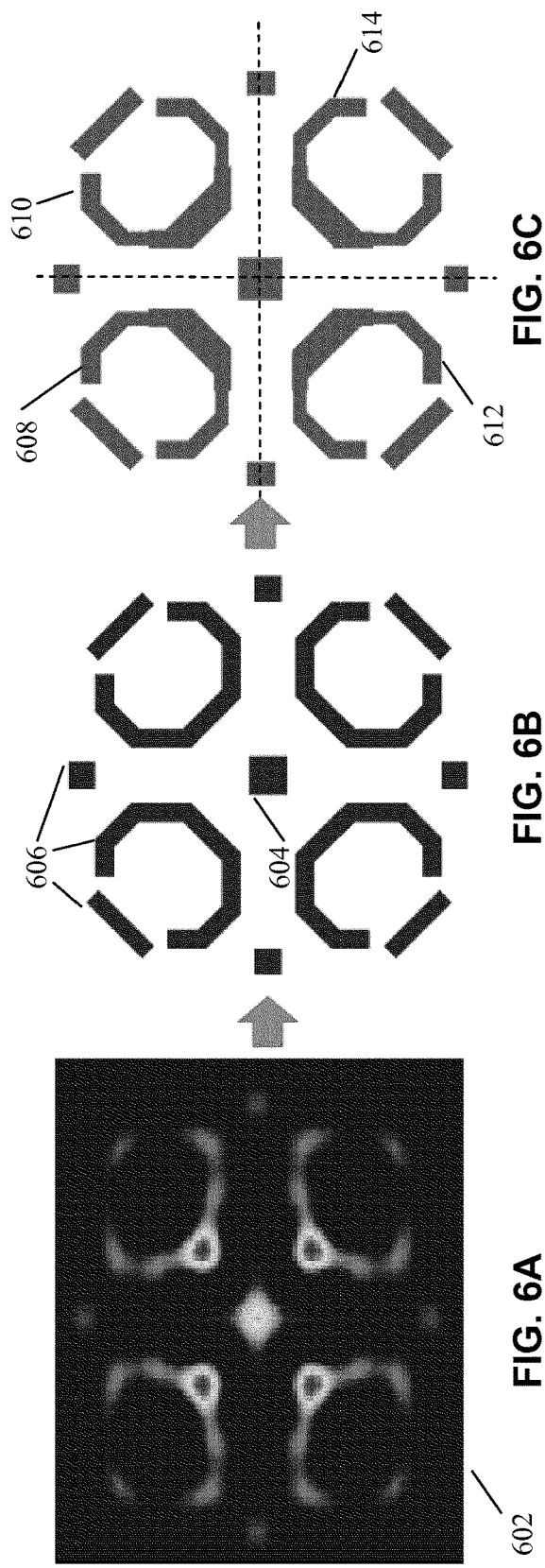
FIGS. 6A to 6C are diagrams illustrating aspects of generating polygons for a mask pattern using a grayscale map computed according to the present embodiments.

A next step according to the present embodiments is to convert the map (i.e. the grayscale mask pattern in space domain obtained in the previous step, an example of which is shown in FIG. 6A) into polygons while satisfying MRCs and suppressing side-lobes. In one example, this process starts with covering the brightest locations in the map with rectangular seeds using a user supplied initial seed-width parameter. The placement starts by placing a seed at the point with the largest intensity and going to the next largest point that is not covered by previous seeds. This process continues until all the points with intensity bigger than a user specified threshold are covered by seeds. The input target geometry 604 is a part of the seeding process so that the topology of the input is kept intact. After the initial rectangles are placed, they are merged into mask-rule compliant polygons 606, and any MRC violations are fixed during the merge process, and symmetry of the polygons 606 is enforced. This placement approach does not necessarily generate the optimal SRAFs. However, this placement is a very good initial guess for an optimization algorithm that can enhance them by moving their edges, examples of which are described in more detail below. These seeds are fed into another optimization that moves their edges to improve lithographic performance, as described in more detail below.

After the initial placement of seeds and merging them into intermediate polygons as described above, the polygons are optimized, for example by moving their edges using techniques known to those skilled in the art. Edges of the main polygons 604 and SRAFs 606 are optimized together. Embodiments apply a fully constrained optimization method that seeks the following goals: (1) The output mask polygons should satisfy all the user defined MRCs; (2) there should be no side-lobes printing within a user defined dose and focus range; (3) the pattern should print on target under best focus and dose conditions; and (4) the process window should be maximized.

FIG. 6C illustrates example results of the optimization from the initial seeds 604, 606 shown in FIG. 6B for the isolated contact. As shown in FIG. 6C this optimization process results in SRAF polygons 608, 610, 612 and 614 that have a symmetrical topology with respect to the spatial domain of the mask pattern.

Figure 7:
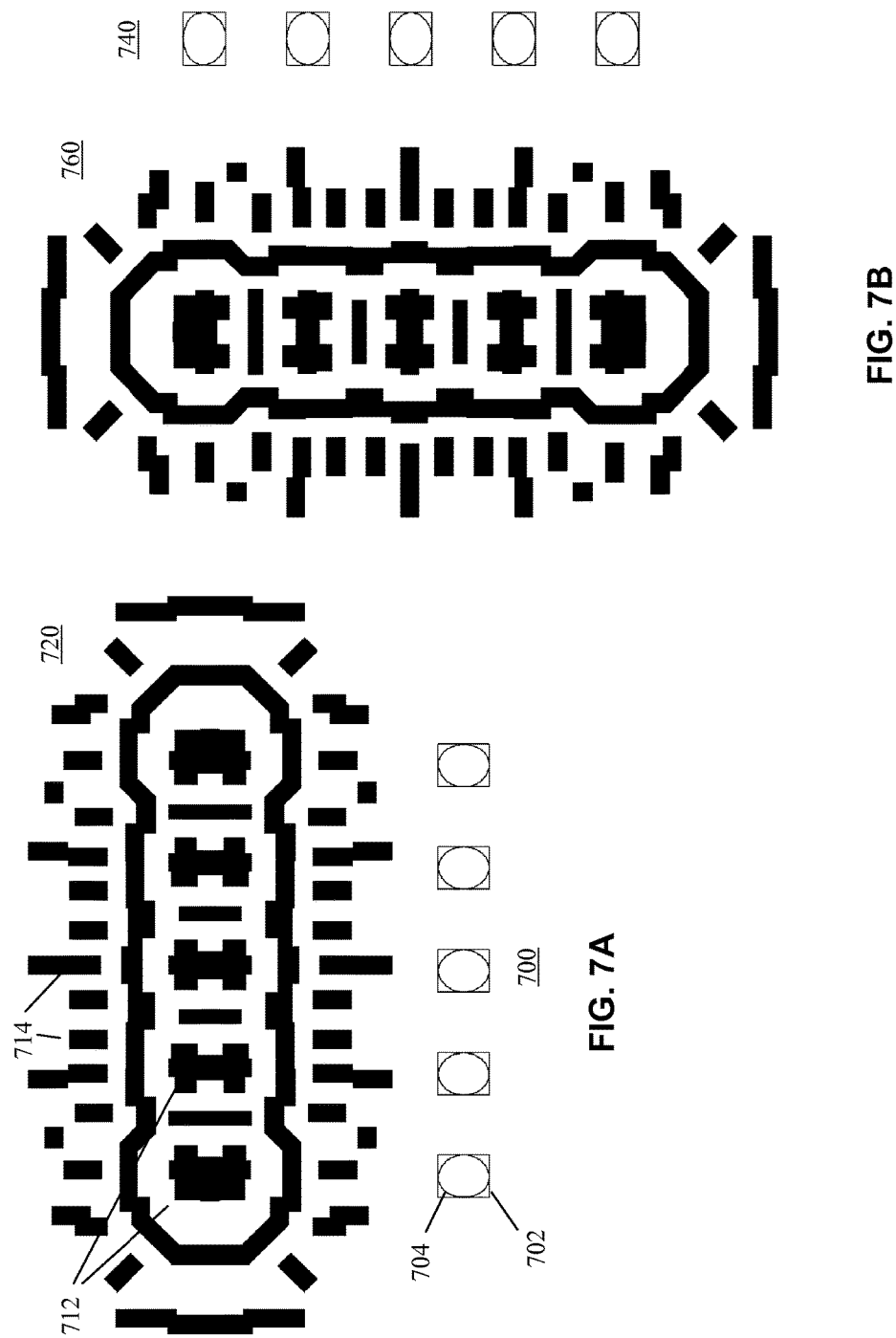
FIGS. 7A and 7B are diagrams illustrating aspects of symmetry achieved according to the present embodiments.

FIGS. 7A and 7B illustrate additional example symmetry aspects of the present embodiments. As shown in FIG. 7A, example mask pattern 720 has been generated from a target pattern 700 using the methodology described above. The target pattern includes target polygons 702 having corresponding printable shapes 704. The generated mask pattern 720 has shapes 712 corresponding to the target polygons and shapes 714 corresponding to SRAFs. According to aspects of the present embodiments, a target pattern 740 shown in FIG. 7B has the exact same topology as target pattern 700 in FIG. 7A, but is rotated by 90 degrees with respect to target pattern 700. However, according to the present embodiments, mask pattern 760 generated according to the present methodology will also have the exact same topology as mask pattern 720, but rotated by 90 degrees with respect to mask pattern 720. To summarize, the ILT solution of the present embodiments is constructed to keep a perfect symmetry with respect to rotation, translation and mirroring.

As will be appreciated by those skilled in the art, inverse lithography is typically much slower than regular OPC. The present applicant has determined that ILT can increase turnaround time (TAT) for a given design by a factor of 6 to 10. However, the ILT solution according to the embodiments is constructed to take advantage of pattern repetition and hierarchy in layouts. Since the solution keeps the original target from the input mask layout, the ILT is used to find and optimize SRAFs for the initial target. Once SRAFs are placed and optimized, the rest of the flow can be the same as a regular OPC flow. The most time consuming part of the ILT solution is the computation of ideal SRAFs. In order to optimize SRAFs it is not necessary to see the geometry within the full length of optical influence (LOI). For SRAF placement (and optimization) it is only necessary to see the geometry that is within a closer proximity of the interest area. Hence the LOI needed for SRAFs is much smaller than the LOI needed for OPC. This allows the computational intensive part of the ILT to use hierarchy with a better reuse ratio than OPC. This way a significant improvement in turnaround time is achieved.

Additionally, pattern matching and behind the scene hierarchy reconstruction can be performed. Sometimes a single design cell may have repetition within itself: the designer may place an array of contacts into a single cell or some cells with repeating patterns may have been flattened by DRC tools. An ILT flow according to the embodiments can analyze the repetition within each cell and reuse the pre-existing solution for the repeated pattern. The hierarchy reconstruction works as long as the design has repeating patterns, even when a user has a flattened design.

In a distributed computing environment according to these and other embodiments, once a target pattern is optimized by a computation node for SRAFs, the result can be saved in a database. If any other computation node encounters the same pattern within its template, it fetches the corresponding SRAFs from the database and skips the computation for the matching part of the template. This pattern matching is done with a smaller LOI than the full OPC LOI, which significantly increases the amount of matching patterns. Note that the database is only used for SRAFs, the final OPC of the main polygon is done using full length of optical influence. The use of this pattern matching method is not limited to distributed environments, it can also be used in a serial computation.

The hierarchy reconstruction and utilization of the database to reuse previously computed solutions can provide a significant TAT boost for ILT. Regular OPC cannot benefit from the same database concept since its length of optical influence is much longer. For a design with no repetition, ILT can be 6 to 10 times slower than regular OPC. However, for a design with a good amount of repetition the TAT of ILT can be reduced to 2 to 3 times to that of regular OPC.

The constructed database can be used for multiple products as long as they use the same process models. Sometimes in a production flow multiple products with very similar design patterns are run. Each new product can use the same database that has been previously optimized. This can provide massive TAT gains for successive tape-outs.

Figure 8:
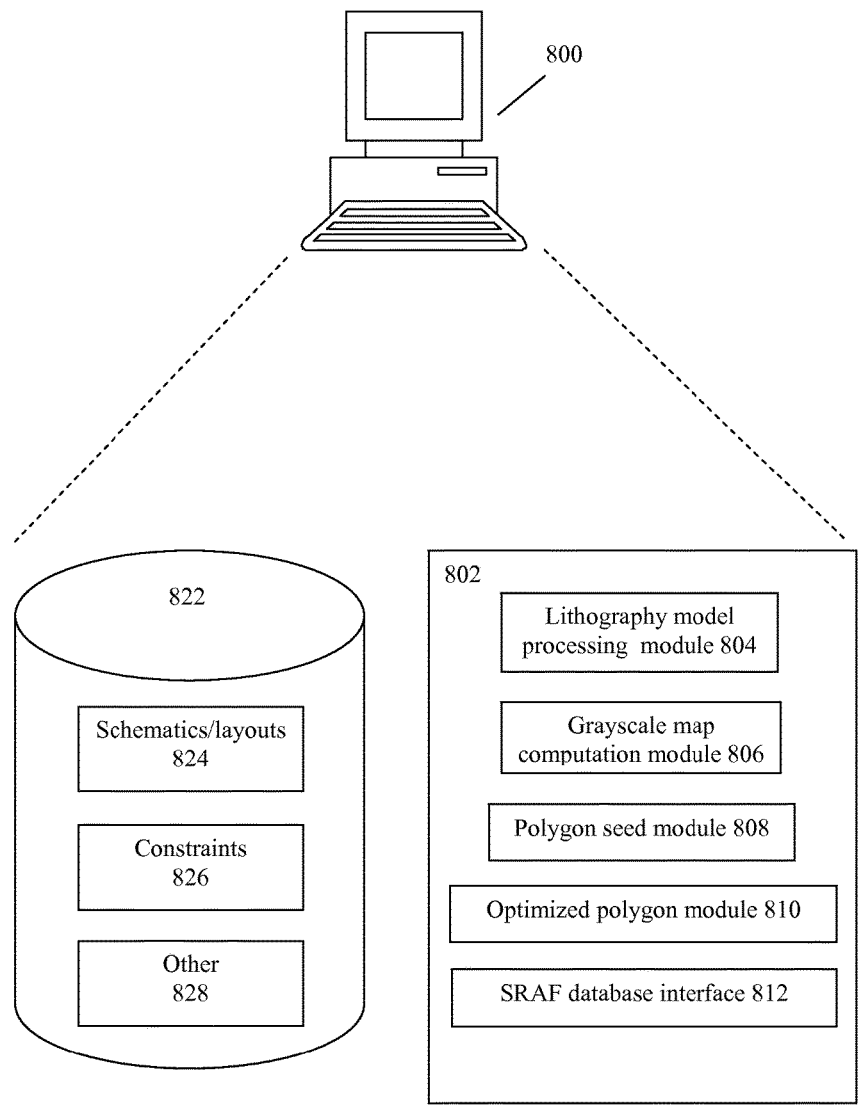
FIG. 8 is a block diagram of an example system for implementing a methodology according to the present embodiments.

FIG. 8 is a functional block diagram of an example system for performing an ILT methodology according to the present embodiments.

In embodiments, the system 800 can be one or more general purpose computers that are loaded with software (e.g., electronic design automation (EDA) and/or computational lithography tools) and/or customized to include hardware for interactively and/or automatically implementing designs of integrated circuits (e.g., ASICs, SOCs, full custom digital ICs, etc.). In some embodiments, the one or more computing systems 800 comprise various components not shown such as processor(s) or processor core(s), memory, disks, etc. The software and/or custom hardware may include interactive or automated integrated circuit design modules such as a placer, a routing engine, a layout editor, a wire editor, a design rule checker, a verification engine, a module generator, a floorplanner and/or a physical verification system, etc. as will be appreciated by those skilled in the art.

The one or more computing systems 800 may further write to and read from a local or remote volatile or non-volatile computer accessible storage 822 that stores thereon data or information such as, but not limited to, one or more databases such as post-placement layouts, schematic design database(s) or physical design database(s) 824 (e.g., GDS II or OASIS data, etc.), libraries, rule decks, constraints (e.g., design rules, mask manufacturability rules, etc.), etc. 826, and/or other information or data 828 (e.g., a database containing SRAF patterns generated from target patterns using the methodology of the present embodiments, lithographic process models, generated mask patterns, etc.) that may be required to support the methodology of the present embodiments.

In some embodiments, the one or more computing systems are implemented in a "cloud" configuration and/or a client/server configuration. For example, one or more server computers may be loaded with application software (e.g., a physical verification system and/or other EDA tool) for implementing some or all of the methodology of the present embodiments, and one or more client computers can communicate with the server computer(s) via a network to perform some or all of the methodology of the embodiments for a particular design.

In some embodiments, the one or more computing systems 800 may, by various standalone software, hardware modules or combinations thereof 802 (e.g., EDA tool or physical verification system), include a model processing module 804 that receives and processes symmetrical lithographic models according to the embodiments. Tool 802 further includes grayscale map computation module 806 for computing grayscale maps for a target pattern, polygon seed generation module 808 for generating initial polygons for a mask pattern corresponding to a target pattern, optimized polygon computation module 810 for optimizing the initial polygons according to MRCS and other design goals and SRAF database interface module 812 for identifying matching target patterns and retrieving stored SRAFs for matching target patterns from storage 822 according to the embodiments. It should be noted that any or all of modules 804, 806, 808, 810 and 812 may be implemented by adapting or communicating with certain pre-existing modules (e.g., layout editor, design rule checker, physical verification system, manufacturability rule checker, etc.) as may be required to implement a methodology to implement design rule correct IC designs according to the present embodiments and as described above. Those skilled in the art will be able to understand how to implement various examples of such modules after being taught by the present disclosure.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of obtaining a mask pattern for printing a target pattern using an optical system, comprising:
    identifying a model of the optical system;
    generating the mask pattern from the target pattern using the model; and
    enforcing symmetry during the generating of the mask pattern such that the generated mask pattern has the same symmetry with respect to an illumination source associated with the optical system,
    wherein generating the mask pattern includes generating a grayscale map corresponding to the target pattern, wherein enforcing symmetry includes causing the generated grayscale map to be symmetric regardless of the position and orientation of the target pattern; and
    preparing a mask in accordance with the generated mask pattern, wherein the mask is configured to be placed in the optical system.

2. The method of claim 1, wherein enforcing symmetry includes forcing values in the identified model to be symmetric before the model is used to generate the mask pattern.

3. The method of claim 2, further comprising generating a plurality of eigenvectors corresponding to the model, wherein enforcing symmetry includes forcing values in each of the plurality of eigenvectors to be symmetric.

4. The method of claim 1, wherein the target pattern includes a plurality of target polygons, and wherein generating the grayscale map corresponding to the target pattern includes:
    generating first grayscale maps for each of the target polygons; and
    combining the first grayscale maps together to obtain the grayscale map corresponding to the target pattern.

5. The method of claim 4, wherein generating the first grayscale maps includes centering the each target polygons in a computation domain.

6. The method of claim 1, further comprising:
    using the grayscale map to create polygon seeds for the mask pattern, including seed polygons corresponding to sub-resolution assist features (SRAFs);
    optimizing the seed polygons, thereby obtaining the mask pattern.

7. The method of claim 6, wherein optimizing is performed in accordance with mask manufacturability rules.

8. The method of claim 6, wherein the target pattern is used for creating the polygon seeds that do not correspond to SRAFs.

9. The method of claim 1, wherein generating the grayscale map is performed using a cost function that optimizes a process window for printing the target pattern using the optical system.

10. A computer readable storage medium comprising instructions recorded thereon, the instructions, when executed by a computer, cause the computer to perform a method of obtaining a mask pattern for printing a target pattern using an optical system, the method comprising:
    identifying a model of the optical system;
    generating the mask pattern from the target pattern using the model; and
    enforcing symmetry during the generating of the mask pattern such that the generated mask pattern has the same symmetry with respect to an illumination source associated with the optical system,
    wherein generating the mask pattern includes generating a grayscale map corresponding to the target pattern, wherein enforcing symmetry includes causing the generated grayscale map to be symmetric regardless of the position and orientation of the target pattern; and
    preparing a file having a format associated with a mask in accordance with the generated mask pattern, wherein the mask is configured to be placed in the optical system.

11. The computer readable storage medium of claim 10, wherein generating the mask pattern includes generating a grayscale map corresponding to the target pattern, wherein enforcing symmetry includes causing the generated grayscale map to be symmetric regardless of the position and orientation of the target pattern.

12. A system for obtaining a mask pattern for printing a target pattern using an optical system, comprising:
    a map computation module that is adapted to generate a map from the target pattern using a model of the optical system, wherein the map computation module is further adapted to enforce symmetry during the generating of the map such that the generated map has the same symmetry with respect to an illumination source associated with the optical system, and wherein enforcing symmetry includes causing the generated map to be symmetric regardless of the position and orientation of the target pattern, wherein the target pattern includes a plurality of target polygons, and wherein the map computation module is further adapted to generate first grayscale maps for each of the target polygons and combine the first grayscale maps together to obtain the map corresponding to the target pattern; and a polygon module that is adapted to use the map to form polygons so as to generate the mask pattern, the polygon module being adapted to enforce symmetry during the generating of the mask pattern such that the generated mask pattern has the same symmetry with respect to the illumination source associated with the optical system, wherein the system is further configured to prepare a file having a format associated with a mask in accordance with the generated mask pattern, wherein the mask is configured to be placed in the optical system.

13. The system of claim 12, further comprising a lithography model processing module that is adapted to forcing values in the model of the optical system to be symmetric before the model is used to generate the map.

14. The system of claim 13, wherein the lithography model processing module is further adapted to generate a plurality of eigenvectors corresponding to the model and to force values in each of the plurality of eigenvectors to be symmetric.

15. The system of claim 12, wherein the map computation module is further adapted to generate the first grayscale maps by centering the each target polygons in a computation domain.

16. The system of claim 12, wherein the polygon module is adapted to use the grayscale map to create polygon seeds for the mask pattern, including seed polygons corresponding to sub-resolution assist features (SRAFs), the system further comprising:

a polygon optimization module adapted to optimize the seed polygons, thereby obtaining the mask pattern.

17. The system of claim 16, further comprising a storage containing mask manufacturability rules, and wherein the polygon optimization module is adapted to optimize the seed polygons in accordance with the mask manufacturability rules.

18. The system of claim 16, wherein the polygon module is adapted to use the target pattern for creating the polygon seeds that do not correspond to SRAFs.

* * * * *